(12) United States Patent
Sonsky et al.

(10) Patent No.: US 9,929,263 B2
(45) Date of Patent: Mar. 27, 2018

(54) SEMICONDUCTOR DEVICE AND METHOD OF MAKING A SEMICONDUCTOR DEVICE

(71) Applicant: Nexperia B.V., Eindhoven (NL)

(72) Inventors: Jan Sonsky, Leuven (BE); Godefridus Adrianus Maria Hurkx, Best (NL); Jeroen Antoon Croon, Waalre (NL); Johannes Josephus Theodorus Marinus Donkers, Valkenswaard (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/374,267

(22) Filed: Dec. 9, 2016

(65) Prior Publication Data

US 2017/0194473 A1 Jul. 6, 2017

(30) Foreign Application Priority Data

Jan. 5, 2016 (EP) ..................................... 16150164

(51) Int. Cl.
*H01L 29/20* (2006.01)
*H01L 29/778* (2006.01)
(Continued)

(52) U.S. Cl.
CPC ...... *H01L 29/7787* (2013.01); *H01L 29/0649* (2013.01); *H01L 29/2003* (2013.01);
(Continued)

(58) Field of Classification Search
CPC ............. H01L 29/7786; H01L 29/0619; H01L 29/2003; H01L 29/207; H01L 29/402;
(Continued)

(56) References Cited

U.S. PATENT DOCUMENTS 7,364,988 B2 * 4/2008 Harris ................. H01L 29/7783
257/E29.249
9,184,275 B2 * 11/2015 Mishra ................. H01L 29/402
(Continued)

FOREIGN PATENT DOCUMENTS

EP 2 575 178 A2 4/2013

OTHER PUBLICATIONS

Extended European Search Report for Patent Appln. No. 16150164.8 (Jul. 12, 2016).
(Continued)

*Primary Examiner* — Roy Potter
(74) *Attorney, Agent, or Firm* — Ohlandt, Greeley, Ruggiero & Perle, L.L.P.

(57) ABSTRACT

A semiconductor device and a method of making the same. The device includes a substrate having an AlGaN layer located on one or more GaN layers, for forming a two dimensional electron gas at an interface between the AlGaN layer and the GaN layer. The device also includes a source contact. The device further includes a drain contact. The device also includes a gate contact located between the source contact and the drain contact. The gate contact includes a gate electrode. The gate contact also includes an electrically insulating layer located between the gate electrode and the AlGaN layer. The insulating layer includes at least one aperture for allowing holes generated during an off-state of the device to exit the device through the gate electrode.

13 Claims, 3 Drawing Sheets

(51) Int. Cl.
  *H01L 29/06*   (2006.01)
  *H01L 29/205*  (2006.01)
  *H01L 29/49*   (2006.01)
  *H01L 29/66*   (2006.01)
  *H01L 29/423*  (2006.01)
  *H01L 29/872*  (2006.01)

(52) U.S. Cl.
  CPC ...... *H01L 29/205* (2013.01); *H01L 29/42316* (2013.01); *H01L 29/42368* (2013.01); *H01L 29/42376* (2013.01); *H01L 29/4966* (2013.01); *H01L 29/66462* (2013.01); *H01L 29/7786* (2013.01); *H01L 29/7788* (2013.01); *H01L 29/872* (2013.01)

(58) Field of Classification Search
  CPC ........... H01L 29/4236; H01L 29/42316; H01L 29/42376; H01L 29/7787; H01L 29/205; H01L 29/7788; H01L 29/0649; H01L 29/4966; H01L 29/66462
  See application file for complete search history.

(56) References Cited

U.S. PATENT DOCUMENTS 9,443,938 B2 * 9/2016 Mishra ................ H01L 29/2003
2014/0001557 A1 1/2014 Mishra et al.

OTHER PUBLICATIONS

Bahl, S.R. et al. "New source-side breakdown mechanism in AlGaN/GaN insulated-gate HEMTs", International Symposium on Power Semiconductor Devices & IC's (ISPSD), Kanazawa, 2013, pp. 419-422 (2013).

Moens, P. et al. "An industrial process for 650V rated GaN-on-Si power devices using in-situ SiN as a gate dielectric", IEEE International Symposium on Power Semiconductor Devices & IC's, pp. 374-377 (2014).

Kikkawa, T. et al. "Commercialization and reliability of 600 V GaN power switches", IEEE International Reliability Physics Symposium, pp. 6C.1.1-6C.1.6 (2015).

* cited by examiner

SEMICONDUCTOR DEVICE AND METHOD OF MAKING A SEMICONDUCTOR DEVICE

CROSS-REFERENCE TO RELATED APPLICATIONS

This application claims the priority under 35 U.S.C. § 119 of European Patent application no. 16150164.8, filed on Jan. 5, 2016, the contents of which are incorporated by reference herein.

BACKGROUND

The present specification relates to a semiconductor device and a method of making a semiconductor device.

In recent years, GaN/AlGaN High Electron Mobility Transistors (HEMTs) have drawn a lot of attention regarding their potential to replace Si or SiC for use as high voltage (HV) devices. A GaN/AlGaN HEMT typically includes a substrate having an AlGaN layer located on a number of GaN layers. A gate, source and drain are located above the AlGaN layer. During operation, current flows between drain and source via a two-dimensional electron gas (2DEG) that is formed at the interface between the AlGaN layer and an upper GaN layer. Switch-off is achieved by applying a suitable voltage to the gate, such that the 2DEG at the interface between the AlGaN layer and the uppermost GaN layer disappears.

In some applications, these devices are switched between an off state, where they block a high drain-to-source voltage while having a low leakage current, and an on-state, where they carry a high current at a low voltage. The design of these devices is such that an optimum trade-off may be found between the power losses in the on-state, off-state and during switching.

Two different gates are typically used in HEMTs. Firstly, the gate may be a Schottky gate, comprising a Schottky contact located on the AlGaN layer. An alternative type of gate is an insulated gate, in which the gate contact is separated from the surface of the AlGaN layer by an insulting layer. Devices including this second type of gate are referred to as Metal Insulator Semiconductor High Electron Mobility Transistors (MISHEMTs). A potential advantage of the MISHEMT is a lower leakage current in the off-state.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:
a substrate having an AlGaN layer located on one or more GaN layers, for forming a two dimensional electron gas at an interface between the AlGaN layer and the GaN layer;
a source contact;
a drain contact; and
a gate contact located between the source contact and the drain contact,
wherein the gate contact comprises:
a gate electrode; and
an electrically insulating layer located between the gate electrode and the AlGaN layer, wherein the electrically insulating layer includes at least one aperture for allowing holes generated during an off-state of the device to exit the device through the gate electrode.

According to another aspect of the present disclosure, there is provided a method of making a semiconductor device, the method comprising:
providing a substrate having an AlGaN layer located on one or more GaN layers, for forming a two dimensional electron gas at an interface between the AlGaN layer and the GaN layer;
forming a source contact of the device;
forming a drain contact of the device; and
forming a gate contact of the device between the source contact and the drain contact by:
forming an electrically insulating layer having at least one aperture; and
forming a gate electrode such that the electrically insulating layer is located between the gate electrode and the AlGaN layer,
wherein the at least one aperture in the electrically insulating layer is suitable for allowing holes generated during an off-state of the device to exit the device through the gate electrode.

In devices such as MISHEMTs, the insulation of the gate electrode from the underlying layers can prevent holes generated during an off-state of the device from exiting the device through the gate electrode. These holes can increase the local body potential in the device, which can lead to an increased electric field, which may lead to device failure or degradation. By providing at least one aperture in the electrically insulating layer, holes generated during an off-state of the device may exit the device through the gate electrode.

The size of the holes may be chosen so as to allow holes to exit the device, while not significantly increasing leakage currents through the gate contact. In some examples, a dimension of the at least one aperture (for instance, the approximate diameter of the at least one aperture (e.g. where the aperture is substantially circular) or an edge of the aperture parallel to the gate length direction (e.g. where the aperture is oblong)) may by around 20-70% of the gate length. The gate length may, for instance be around 1-3 µm. In one example, a dimension of the at least one aperture (e.g. the approximate diameter of the at least one aperture) may be around 0.5-2 µm. In some examples, a spacing (e.g. average spacing) between adjacent apertures (e.g. in a gate width direction substantially perpendicular to the gate length direction) may be approximately 5-20 µm.

The total cross sectional area of the at least one aperture in the electrically insulating layer between the between the gate electrode and the AlGaN layer when viewed from above the AlGaN layer may be denoted by $\Sigma A_{apertures}$. The area of the gate electrode when viewed from above the AlGaN layer may be denoted by $A_{gate}$. The ratio of these two areas may be chosen so as to allow holes to exit the device, while not significantly increasing leakage currents through the gate contact. In some examples, the ratio of the total area of the apertures to the area of the gate electrode may be in the range $0.01 \leq \Sigma A_{apertures}/A_{gate} \leq 0.1$.

The electrically insulating layer may include a plurality of the apertures. The apertures may be arranged in a regular array. This may allow the apertures to be evenly distributed across the gate contact. The at least one aperture may be circular or rectangular (e.g. oblong), when viewed from above the AlGaN layer.

At least a part of the gate electrode may extend into the at least one aperture in the electrically insulating layer. In this way, part of gate electrode may brought closer to the underlying parts of the device, to allow holes to exit the device. In some examples, the part of the gate electrode that extends into the at least one aperture in the electrically insulating layer may directly contact the AlGaN layer or a GaN layer located on the AlGaN layer.

The gate electrode may include a first electrode portion and a second electrode portion. The first electrode portion may include at least one aperture aligned with the at least one aperture in the electrically insulating layer. The second electrode portion may substantially fill the at least one aperture in the first electrode portion. A gate contact of this kind may, for instance, conveniently be manufactured by depositing the first electrode portion on the electrically insulating layer and by etching (e.g. dry etching) apertures through both the first electrode portion and the electrically insulating layer. The second electrode potion may then be deposited to fill the apertures. The part of the gate electrode that may extend into the at least one aperture in the electrically insulating layer as described above may be the second electrode portion.

The first electrode portion and the second electrode portion may comprise different electrically conductive materials. This may allow for optimisation to the gate contact and may also allow the material of the second electrode portion to match that used for a gate electrode in other parts of the device.

The gate contact may include a further electrically insulating layer located between the gate electrode and the AlGaN layer. The further insulating layer may extend across the at least one aperture in the insulating layer. This can increase the electrical resistance of the path through the at least one aperture in the insulating layer, for reducing leakage currents in the device. In examples in which the electrically conductive material forming the gate electrode is also used to form a Schottky contact elsewhere on the substrate, the Schottky contact elsewhere on the substrate can have a relatively low Schottky barrier, while the contact formed at the at least one aperture in the electrically insulating layer may have a relatively high Schottky barrier owing to the presence of the further insulating layer. The thickness and/or composition of the further insulating layer may be chosen to reduce leakage currents while still allowing holes to exit through the gate contact. For instance, the further insulating layer may have a thickness in the range 1 nm≤T≤10 nm. The further insulating layer may comprise AlN, Al2O3, SiN, SiO.

The gate electrode may comprise a stack of metal layers. The stack may, for instance, include TiW/Al, TiWN/Al TiN/Al, Tungsten or AlCu. Here, the materials in each layer are denoted using a "/" (e.g. TiW/Al refers to a stack of layers comprising a TiW layer and an Al layer, with the lowest layer in the stack being listed first).

In some examples, the device may further include a GaN cap layer located on the AlGaN layer.

For the purposes of this disclosure, the electron mobility in a High Electron Mobility Transistor (HEMI) may be in the range 1000-3000 cm^2/V/s or in the range 1000-2000 cm^2/V/s.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Embodiments of this disclosure may provide a semiconductor device, such as a High Electron Mobility Transistor (HEMT). The HEMT may be a Metal Insulator Semiconductor High Electron Mobility Transistor (MISHEMT).

The device may include a substrate having an AlGaN layer located on one or more GaN layers. A two dimensional electron gas ("2DEG") may form at an interface between the AlGaN layer and the (uppermost) GaN layer. A current flowing within the 2DEG may form the basis for the operation of the device. In accordance with embodiments of this disclosure, the electron mobility in the 2DEG of such a device may be in the range 1000-3000 cm^2/V/s or more particularly in the range 1000-2000 cm^2/V/s.

The device may include a source contact, a drain contact and a gate contact. These contact may be located at, for instance, an surface of the AlGaN layer. In other example, the contacts may be located at surface of a layer that is located on or above the AlGaN layer. For instance, the device may include a GaN cap layer on the AlGaN layer, and the contacts may be located at a surface of the GaN cap layer. At least a part of the source contact and the drain contact may extend down through the AlGaN layer (and any layers such as a GaN cap layer located on the AlGaN layer) directly to contact the (uppermost) GaN layer. The gate contact may be located between the source contact and the drain contact. In operation, current may flow within the 2DEG, between the source contact and the drain contact. A potential may be applied to the gate contact to modulate this current.

The gate contact may include a gate electrode. The gate contact may also include an electrically insulating layer, which may be located between the gate electrode and the AlGaN layer. This electrically insulating layer may include at least one aperture. The at least one aperture may allow holes which may be generated during an off-state of the device to exit the device through the gate electrode. As will be described in more detail below, this may allow problems relating to an increased local body potential within the device (e.g. beneath the gate or under field plates) to be addressed.

Figure 1:
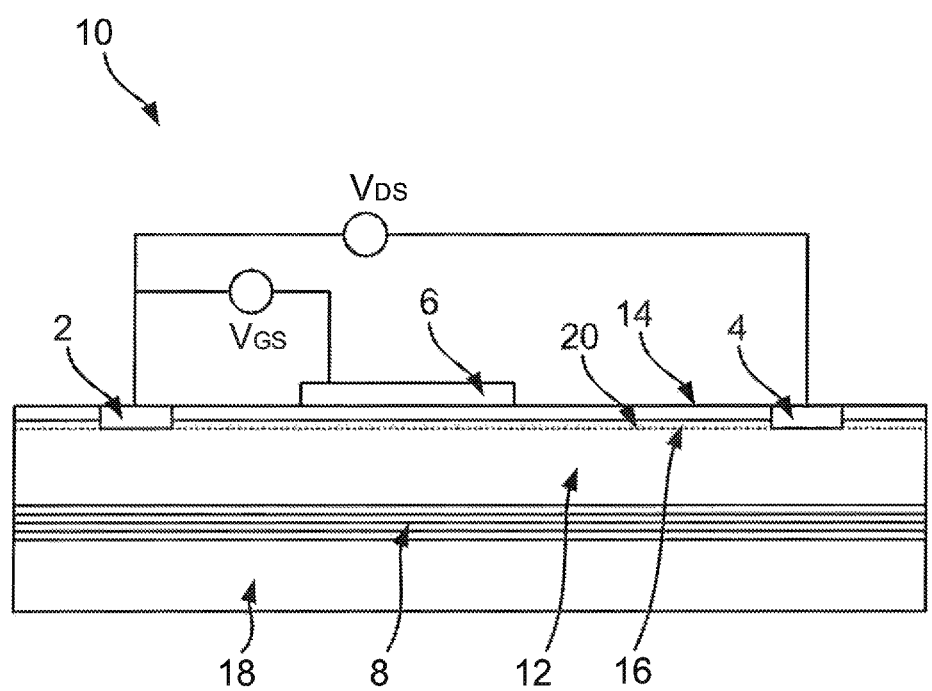
FIG. 1 shows a semiconductor device comprising a High Electron Mobility Transistor (HEMT)

FIG. 1 shows an example of a device 10 comprising a MISHEMT. The device 10 includes a substrate 18 that has a plurality of GaN layers 8, 12 and an AlGaN layer 16. The GaN layers 8, form a super lattice for matching the lattice parameters of the structure of the GaN layer 12 to those of the underlying substrate 18. The underlying substrate 18 may, for instance, comprise a silicon substrate. The GaN layer 12 is located on the layers 8 forming the super lattice. The GaN layer 12 is p-type. The AlGaN layer 16 is located on the GaN layer 12. In operation, a 2DEG 20 may form at an interface between the GaN layer 12 and the AlGaN layer 16.

The device 10 includes a source contact 2, a drain contact 4 and a gate contact 6. The gate contact 6 includes a gate electrode that is separated from the AlGaN layer 16 by a dielectric layer 14 that is located on the AlGaN layer 16. In operation, voltages $V_{GS}$ and $V_{DS}$ applied to the source contact 2, drain contact 4 and gate contact 6 allow a current to flow within the 2DEG 20, between the source contact 2 and the drain contact 4. This current may be modulated by the potential that is applied to the gate contact 6.

Although a MISHEMT may, in principal reduce leakage through the gate contact 6 (compared to, for instance, a HEMT having a gate formed from at Schottky contact located on the AlGaN layer 16), the insulated gate contact 6 in a MISHEMT may prevent holes generated during the off state (e.g. due to avalanche multiplication, tunnelling or emission from traps) from exiting the device.

In a HEMT having a gate comprising a Schottky, these holes may be removed through the gate, which may be forward biased for holes during the off-state. For a device (e.g. a MISHEMT of the kind shown in FIG. 1) having an insulated gate though, this is not possible, since the insulating layer 20 may block the route for these holes to exit the device 10 through the gate contact 6. These holes may also not be removed vertically to the substrate 18 either, because the super lattice formed by the GaN layers 8 may be highly resistive.

The generation of these holes may result in a local increase of the potential until the electric field is so high that the holes are removed with the same rate as they are generated, either through the super lattice or laterally to the source 2. This local increase in the body potential under the gate contact 6 or under the field plates may lead to an increased electric field which may lead to device failure or degradation.

Figure 2:
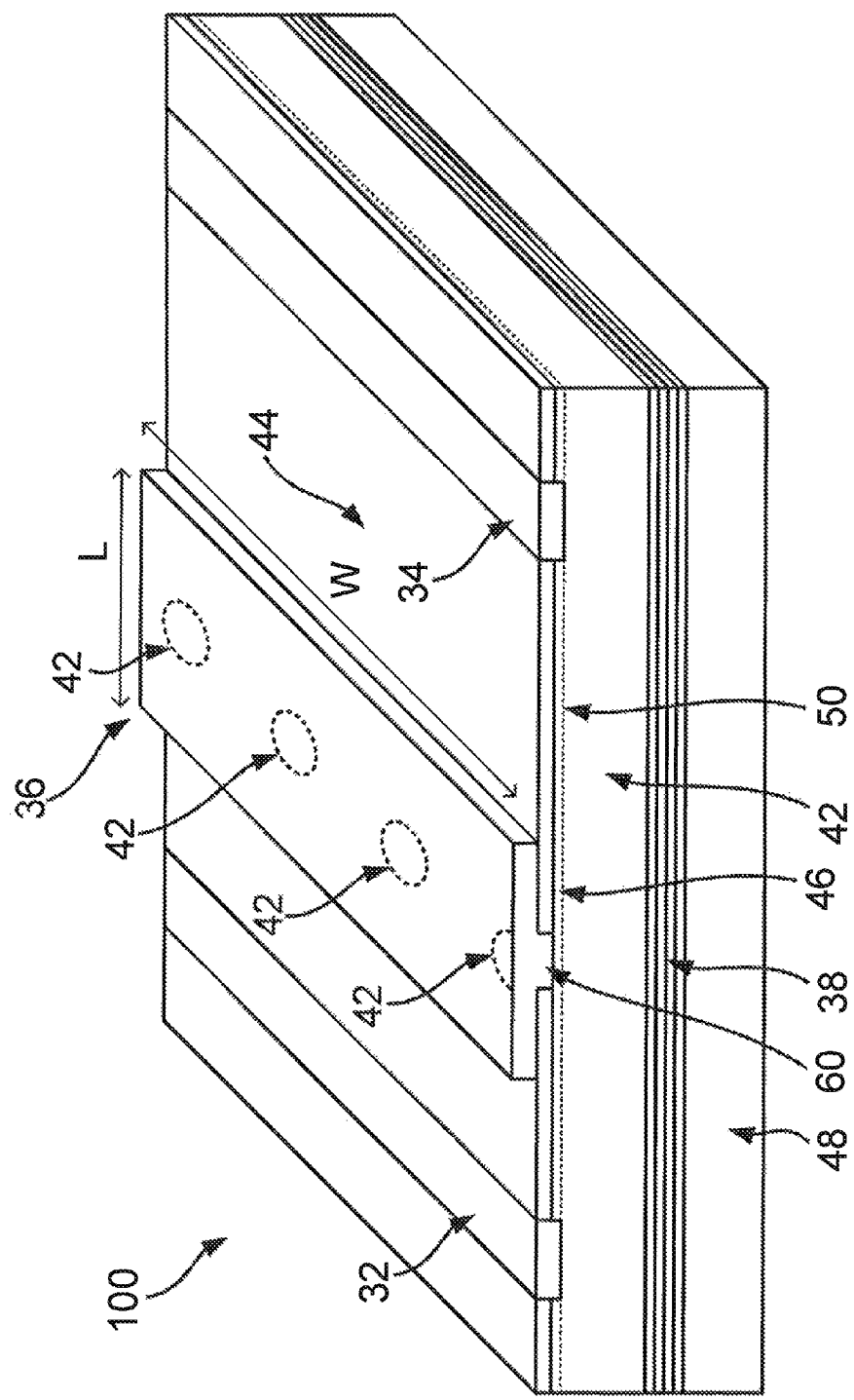
FIG. 2 shows a semiconductor device according to an embodiment of this disclosure.

FIG. 2 shows a semiconductor device 100 according to an embodiment of this disclosure.

The device 100 includes a substrate 48. The substrate 48 may have a plurality of GaN layers 38, 42 and an AlGaN layer 46. The substrate 48 may, for instance, be a silicon substrate, although it is also envisaged that the substrate 48 may comprise a Sapphire or SiC upon which the GaN layers 38, 42 and AlGaN layer 46 are provided.

The GaN layers 38, may form a super lattice for matching the lattice parameters of the GaN layer 42 to the underlying substrate 48. The GaN layer 42 is located on the layers 38 forming the super lattice. The GaN layer 42 may be p-type. The AlGaN layer 46 is located on the GaN layer 42. In operation, a 2DEG 50 may form at an interface between the GaN layer 42 and the AlGaN layer 46.

The device 10 includes a source contact 32, a drain contact 34 and a gate contact 36. The source contact 32 and the drain contact 34 may each comprise an electrode comprising electrically conductive material. The source and drain electrodes may, in some embodiments comprise a stack of metal layers which may be deposited on the device and patterned during manufacture. The metal layers may, for instance, comprise Ti/Al/TiWN or TaAl or Ti/Al/Ni/Au. The source and drain electrodes may each form an ohmic contact. The gate contact 36 may be located between the source contact 32 and the drain contact 34 on a major surface of the device 100.

The gate contact 36 includes a gate electrode 37 that is separated from the AlGaN layer 46 by an electrically insulating layer 44. The gate electrode may include a stack of metal layers. For example, the gate electrode 37 may include TiW/Al, TiWN/Al, TiN/Al, Tungsten, or AlCu. Here, the materials in each layer are denoted using a "/" (e.g. TiW/Al refers to a stack of layers comprising a TiW layer and an Al layer, with the lowest layer in the stack being listed first).

The electrically insulating layer 44 may comprise a dielectric such as SiN, Al2O3, SiO or combination of such layers. In a further example, the electrically insulating layer 44 may also comprise in-situ MOCVD deposited SiN (which may be deposited as last step of GaN epitaxy growth). The electrically insulating layer 44 may be located between the gate electrode 37 and the AlGaN layer 46, thereby electrically to isolate the gate electrode 37 from the AlGaN layer 46. Accordingly, the device 100 may be a Metal insulator Semiconductor High Electron Mobility Transistor (MISHEMT).

In the present example, the electrically insulating layer 44 is located on the AlGaN layer 46 and the gate electrode 37 is located on the electrically insulating layer 44. It is envisaged that there may be further layers located between the AlGaN layer 46 and the gate electrode 37. For instance, in some examples, a GaN cap layer may be located on the AlGaN layer 46. In such examples, the electrically insulating layer 44 may be located on the GaN cap layer and the gate electrode 37 may be located on the electrically insulating layer 44.

In the present example, the electrically insulating layer 44 extends across the device 100. To make contact with the underlying layers of the device, the source contact 32 and the drain contact 34 may extend through the electrically insulating layer 44, For example, as shown in FIG. 2, the source contact 32 and the drain contact 34 may extend through both the electrically insulating layer 44 and the AlGaN layer 46 to contact directly with the GaN layer 42. It is envisaged that in other examples, the electrically insulating layer 44 may be local to the gate contact 36, whereby the source contact 32 and the drain contact 34 need not pass through the electrically insulating layer 44.

In operation, voltages (e.g. $V_{GS}$ and $V_{DS}$) may be applied to the source contact 32, drain contact 34 and gate contact 36 cause a current to flow within the 2DEG 50, between the source contact 32 and the drain contact 34. This current may be modulated by varying the potential that is applied to the gate contact 36.

The electrically insulating layer 44 may include at least one aperture 60. In some examples, a plurality of such apertures 60 may be provided. The at least one aperture 60 may allow holes generated during an off-state of the device 100 to exit the device 100 through the gate electrode 37.

The at least one aperture 60 may, be arranged in an array, when viewed from above the AlGaN layer 46. The array me be a random array. Alternatively, the array may be a regular array (e.g. a linear, rectangular or hexagonal array), which may ensure that the apertures are evenly distributed across the gate contact 36. In the example shown in FIG. 2, the electrically insulating layer 44 includes a plurality of apertures 60, which are provided in a linear array comprising a single row.

The at least one aperture 60 in the electrically insulating layer 44 may, when viewed from above the AlGaN layer 46, have a regular shape such as substantially circular, substantially oval or substantially rectangular (e.g. square, or configured as a number of stripes). In the example shown in FIG. 2, the apertures 60 are substantially circular.

The size and shape of the at least one aperture 60 in the electrically insulating layer 44 may be chosen to allow holes to exit the device 100 through the gate electrode 37, while preventing unacceptable levels of leakage current through the gate contact 36. This may, for instance, be achieved by varying the cross sectional area $A_{aperture}$ of the at least one aperture 60 (when viewed from above the AlGaN layer 46) and/or by varying the total cross sectional area $\Sigma A_{apertures}$ of the apertures 60 (when viewed from above the AlGaN layer 46). In principle, the areas $A_{aperture}$ and $\Sigma A_{apertures}$ may be small compared to the overall area $A_{gate}$ of the gate electrode 37, so that the device 100 may operate as a MISHEMT (in contrast to a HEMT having a high-leakage Schottky gate). On the other hand, the areas $A_{aperture}$ and $\Sigma A_{apertures}$ may be sufficiently large such that a significant proportion of any holes generated in an off-state of the device 100 may pass through the at least on aperture 60 to exit the device 100 through the gate electrode 37.

In some examples, a dimension of the at least one aperture (for instance, the approximate diameter of the at least one aperture (e.g. where the aperture is substantially circular) or an edge of the aperture parallel to the gate length direction (e.g. where the aperture is oblong)) may by around 20-70% of the gate length. The gate length may, for instance be around 1-3 µm. In one example, a dimension of the at least one aperture (e.g. the approximate diameter of the at least one aperture) may be around 0.5-2 µm. In some examples, a spacing (e.g. average spacing) between adjacent apertures (e.g. in a gate width direction (indicated by the arrow labelled W in FIG. 2) substantially perpendicular to the gate length direction (indicated by the arrow labelled L in FIG. 2)) may be approximately 5-20 µm.

In some examples, ratio of the total cross sectional area of the at least one aperture 60 to the area of the gate electrode 37 (when viewed from above the AlGaN layer 46) may be in the range $0.01 \leq \Sigma A_{apertures}/A_{gate} \leq 0.1$.

In some examples, such as that shown in FIG. 2, at least a part of the gate electrode 37 may extend into the at least one aperture 60 in the electrically insulating layer 44. This may allow a (relatively small) part of the gate electrode 37 to extend toward the underlying layers of the device. For instance, as shown in FIG. 2, the part of the gate electrode 37 that extends into the at least one aperture 60 directly contacts the AlGaN layer 46. This direct contact between the gate electrode 37 and the AlGaN layer 46 may reduce resistance to holes exiting the device 100. Since $A_{aperture}$ and $\Sigma A_{apertures}$ are small compared to $A_{gate}$, the device may, as noted above, still operate as a low leakage MISHEMT. In examples in which other layers (such as a GaN cap layer) are located between the gate electrode 37 and the AlGaN layer 46, the part of the gate electrode that extends through the at least one aperture 60 may directly contact one of those layers (e.g. an upper surface of the GaN cap layer).

Figure 3:
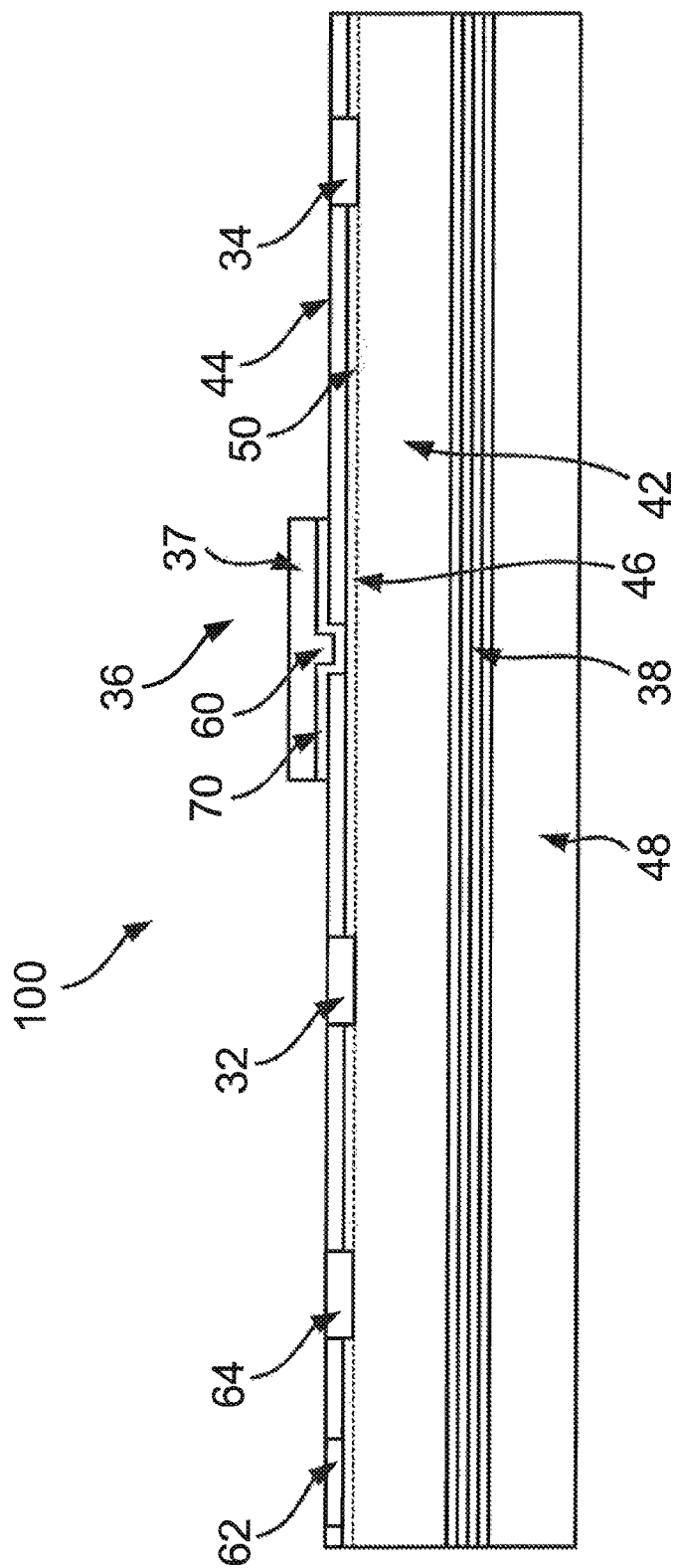
FIG. 3 shows a semiconductor device according to another embodiment of this disclosure.

FIG. 3 shows a semiconductor device 100 according to another embodiment of this disclosure. In some respects, the embodiment in FIG. 3 is similar to that described above in relation to FIG. 2. The device 100 includes a substrate 48, which may be of the kind described above in relation to FIG. 2, and which may have a plurality of GaN layers 38, 42 and an AlGaN layer 46.

As described previously, the GaN layers 38 may firm a super lattice for matching the lattice parameters of the GaN layer 42 to the underlying substrate 48. The GaN layer 42 is located on the layers 38 forming the super lattice. The GaN layer 42 may be p-type. The AlGaN layer 46 is located on the GaN layer 42. In operation, a 2DEG 50 may form at an interface between the GaN layer 42 and the AlGaN layer 46.

The device 10 includes a source contact 32, a drain contact 34 and a gate contact 36. The source contact 32 and the drain contact 34 may each be contacts of the kind described above in relation to FIG. 2. Again, in this example, the gate contact 36 may be located between the source contact 32 and the drain contact 34 on a major surface of the device 100.

The gate contact 36 includes a gate electrode 37 that is separated from the AlGaN layer 46 by an electrically insulating layer 44. The electrically insulating layer 44 may be a layer of the kind already described above in relation to FIG. 2. Again, the gate electrode may include a stack of metal layers. For example, the gate electrode 37 may include TiW/Al, TiWN/Al, TiN/Al, Tungsten, or AlCu. As with the example of FIG. 2, further layers, such as a GaN cap layer, may be located between the AlGaN layer 46 and the gate electrode 37.

The electrically insulating layer 44 may include at least one aperture 60. Except for the additional details noted below, the at least one aperture 60 may be configured similarly to those described above in relation to FIG. 2.

In the example of FIG. 3, the gate contact 36 includes a further electrically insulating layer 70. The further insulating layer 70 in this example is located between the gate electrode 37 and the AlGaN layer 46. The further insulating layer 70 may extend across the at least one aperture 60 in the insulating layer 44. This may increase the electrical resistance of the path for leakage currents through the at least one aperture 60, while still allowing holes to exit the device 100 through the gate electrode 37. Moreover, in examples in which the electrically conductive material forming the gate electrode is also used to form a Schottky contact elsewhere on the substrate 48 (see the examples described herein below), the Schottky contact elsewhere on the substrate 48 can have a relatively low Schottky barrier, while the contact formed at the at least one aperture 60 in the electrically insulating layer 44 may have a relatively high Schottky barrier owing to the presence of the further insulating layer 70.

In the example of FIG. 3, the further insulating layer 70 located above the insulating layer (excepting any parts of the further insulating layer 70 that are located within the at least one aperture 60). However, it is also envisaged that the further insulating layer 70 may be located beneath the electrically insulating layer 44 (e.g. the further insulating layer 70 may be located between the AlGaN layer 46 (or a GaN cap layer) and the electrically insulating layer 44. Such examples may be manufactured by depositing the further insulating 70 layer prior to depositing and patterning the electrically insulating layer 44.

The composition and thickness of the further insulating layer 70 may be chosen to optimise the balance between allowing holes to exit the device 100 through the gate electrode 37 and keeping gate leakage to an acceptable level. The further insulating layer 70 may comprise AlN, Al2O3, SiN, SiO. The further insulating layer 70 may be thin compared to the thickness of the electrically insulating layer 44. The further insulating layer 70 may have a thickness in the range $1\ nm \leq T \leq 10\ nm$.

In the example of FIG. 3, the further insulating layer 70 extends across the gate contact 36. It is envisaged that in other examples, the further insulating layer 70 may be contained within the at least one aperture 60.

In some examples, the part of the further insulating layer 70 that extends across the at least one aperture 60 may directly contact a layer (such as the AlGaN layer 46 or a GaN cap layer) located beneath the electrically insulating layer 44. In the example of FIG. 3, the part of the further insulating layer 70 that extends across the at least one aperture 60 directly contacts the AlGaN layer 46.

In examples in which a part of the gate electrode 37 extends into the at least one aperture 60 (e.g. as in FIG. 3), this part of the gate electrode 37 may be substantially surrounded by the further insulating layer 70. The part of the gate electrode 37 extends into the at least one aperture 60 may be separated from the underlying layer (e.g. the AlGaN layer 46 or a GaN cap layer) by the further insulating layer 70.

A method of making a semiconductor device of the kind described herein may include providing a substrate having an AlGaN layer located on one or more GaN layers. The substrate, the AlGaN layer and the one or more GaN layers may be of the kind described above in relation to FIGS. 2 and 3. The AlGaN and GaN layers may be epitaxially grown. As already described, a two dimensional electron gas (2DEG) may form at an interface between the AlGaN layer and the GaN layer.

A method of making the device may also include forming a source contact and a drain contact of the device. These contacts may be formed using lithographic techniques for depositing and patterning an electrically conductive material for forming the electrodes of the contacts. In some examples, an etching process may be used to open one or more apertures through the electrically insulating layer and/or further layers such as a GaN cap layer and the AlGaN, to allow the source and drain contacts of the device to reach the GaN layer beneath the AlGaN layer.

A method of making the device may also include forming a gate contact of the device. The gate contact may be of the kind described above in relation to FIGS. 2 and 3. Forming the gate contact may include forming an electrically insulating layer having at least one aperture and forming a gate electrode such that the previously described electrically insulating layer is located between the gate electrode and the AlGaN layer.

The method may further include forming at least one aperture in the electrically insulating layer as described above. This may, in one example, be achieved by first depositing the electrically insulating layer and then using an etching process (e.g. dry etching) to etch through the electrically insulating layer to generate the apertures. The gate electrode may then be deposited (in some embodiments, the further insulating layer may be deposited, followed by the gate electrode).

The deposition step used to form the gate electrode may also be used to form other contacts, elsewhere on substrate. An example of this is shown in FIG. 3, in which a Schottky diode comprising an Schottky anode contact 62 and an ohmic cathode contact 64 are provided. In such examples, the metal deposited to form the gate electrode may also be used to form the Schottky contact 62. For instance, as noted above, the gate electrode may be provided as a stack of metal layers. These layers may, for instance include TiW/Al or TiWN/Al or TiN/Al and variants with different nitrogen contact in TiW. These metals are particularly suitable for Schottky contact formation elsewhere on the substrate.

Another example of a method for forming the gate contact of the device may include depositing and patterning the electrically insulating layer and a first electrode portion of the gate electrode and then using an etching process (e.g. dry etching) to form at least one aperture passing through the first electrode portion and the electrically insulating layer. As they may be formed using the same etching process, the at least one aperture in the first electrode portion may be aligned with the at least one aperture in the electrically insulating layer. A second electrode portion of the gate electrode may then be deposited. The second electrode portion may substantially fill the at least one aperture in the first electrode portion. At least part of the second electrode portion may also extend over an upper surface of the first electrode portion. The second electrode portion may also extend into the at least one aperture in the electrically insulating layer as noted above.

In this example, the electrically conductive material of the first electrode portion may be a different electrically conductive material to the electrically conductive material of the second electrode portion. For instance, the electrically conductive material of the first electrode portion may be chosen to be optimised for MISHEMT operation (note that the first electrode portion is separated from the underlying layers such as the AlGaN layer by the electrically insulating layer), while the electrically conductive material of the second electrode portion may be chosen to be optimised for use as a Schottky contact. Hence, similar to the example described above, the deposition step that is used to form the second electrode portion may also be used to deposit a Schottky contact elsewhere on the substrate (e.g. as part of a Schottky diode).

Accordingly, there has been described a semiconductor device and a method of making the same. The device includes a substrate having an AlGaN layer located on one or more GaN layers, for forming a two dimensional electron gas at an interface between the AlGaN layer and the GaN layer. The device also includes a source contact. The device further includes a drain contact. The device also includes a gate contact located between the source contact and the drain contact. The gate contact includes a gate electrode. The gate contact also includes an electrically insulating layer located between the gate electrode and the AlGaN layer. The insulating layer includes at least one aperture for allowing holes generated during an off-state of the device to exit the device through the gate electrode.

Although particular embodiments of this disclosure have been described, it will be appreciated that many modifications/additions and/or substitutions may be made within the scope of the claims.

The invention claimed is:

1. A semiconductor device comprising:
a substrate having an AlGaN layer located on one or more GaN layers, for forming a two dimensional electron gas at an interface between the ALGaN layer and the GaN layer;
a source contact;
a drain contact; and
a gate contact located between the source contact and the drain contact, wherein the gate contact comprises:
a gate electrode comprising a first electrode portion and a second electrode portion; and
an electrically insulating layer located between the gate electrode and the AlGaN layer, wherein the electrically insulating layer includes at least one aperture for allowing holes generated during an off-state of the device to exit the device through the gate electrode,
wherein the first electrode portion includes at least one aperture aligned with the at least one aperture in the electrically insulating layer, and
wherein the second electrode portion substantially fills the at least one aperture in the first electrode portion.

2. The device of claim 1, wherein the at least one aperture has a dimension that is approximately 20-70% of a gate length of the device.

3. The device of claim 1 where $\Sigma A_{apertures}$ is the total cross sectional area of the at least one aperture in the electrically insulating layer between the gate electrode and the AlGaN layer when viewed from above the AlGaN layer, where $A_{gate}$ is the area of the gate electrode when viewed from above the AlGaN layer, and wherein $0.01 \leq \Sigma A_{apertures}/A_{gate} \leq 0.1$.

4. The device of claim 1, wherein the electrically insulating layer comprises a plurality of the apertures.

5. The device of claim 4, wherein the apertures are arranged in a regular array.

6. The device of claim 1, wherein the at least one aperture is circular or rectangular, when viewed from above the AlGaN layer.

7. The device of claim 1, wherein the first electrode portion and the second electrode portion comprise different electrically conductive materials.

8. The device of claim 1, wherein at least a part of the gate electrode extends into the at least one aperture in the electrically insulating layer.

9. The device of claim 1, wherein the gate contact comprises a further electrically insulating layer located between the gate electrode and the AlGaN layer, wherein the further insulating layer extends across the at least one aperture in the insulating layer for reducing leakage currents in the device.

10. The device of claim 9, wherein the further insulating layer has a thickness in the range 1 nm≤T≤10 nm.

11. The device of claim 9, wherein the further insulating layer comprises a material selected from the group consisting essentially of AlN, Al2O3, SiN, and SiO.

12. The device of claim 1, wherein the gate electrode comprises a material selected from the group consisting essentially of TiW/Al, TiWN/Al TiN/Al, Tungsten and AlCu.

13. A method of making a semiconductor device, the method comprising:

providing a substrate having an AlGaN layer located on one or more GaN layers, for forming a two dimensional electron gas at an interface between the AlGaN layer and the GaN layer;

forming a source contact of the device;

forming a drain contact of the device; and forming a gate contact of the device between the source contact and the drain contact by:

forming an electrically insulating layer having at least one aperture; and forming a gate electrode comprising a first electrode portion and a second electrode portion such that the electrically insulating layer is located between the gate electrode and the AlGaN layer, wherein the at least one aperture in the electrically insulating layer is formed to allow holes generated during an off-state of the device to exit the device through the gate electrode, wherein the first electrode portion includes at least one aperture aligned with the at least one aperture in the electrically insulating layer, and wherein the second electrode portion substantially fills the at least one aperture in the first electrode portion.

* * * * *